United States Patent
Arai et al.

(10) Patent No.: US 8,912,622 B2
(45) Date of Patent: Dec. 16, 2014

(54) SEMICONDUCTOR DEVICE

(71) Applicant: Kabushiki Kaisha Toshiba, Tokyo (JP)

(72) Inventors: Masatoshi Arai, Hyogo-ken (JP); Takashi Tabuchi, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/904,869

(22) Filed: May 29, 2013

(65) Prior Publication Data

US 2014/0167201 A1 Jun. 19, 2014

(30) Foreign Application Priority Data

Dec. 18, 2012 (JP) ................................. 2012-276212

(51) Int. Cl.
- *H01L 29/872* (2006.01)
- *H01L 29/08* (2006.01)
- *H01L 29/06* (2006.01)
- *H01L 29/16* (2006.01)

(52) U.S. Cl.
CPC .............. *H01L 29/872* (2013.01); *H01L 29/08* (2013.01); *H01L 29/1608* (2013.01); *H01L 29/0615* (2013.01); *H01L 29/0611* (2013.01)
USPC ...... 257/471; 257/73; 257/472; 257/E21.359; 257/E29.148

(58) Field of Classification Search
CPC .............. H01L 27/0817; H01L 29/872; H01L 29/66136; H01L 29/66143; H01L 29/8725
See application file for complete search history.

(56) References Cited

U.S. PATENT DOCUMENTS

| | | | |
|---|---|---|---|
| 6,049,108 A * | 4/2000 | Williams et al. .............. | 257/341 |
| 7,902,626 B2 | 3/2011 | Goerlach et al. | |
| 2002/0008237 A1* | 1/2002 | Chang et al. .................... | 257/54 |
| 2002/0125541 A1* | 9/2002 | Korec et al. .................... | 257/471 |
| 2007/0034901 A1* | 2/2007 | Lui et al. ........................ | 257/197 |
| 2007/0075392 A1* | 4/2007 | Pan et al. ....................... | 257/483 |
| 2009/0283776 A1* | 11/2009 | Iwamuro ......................... | 257/76 |
| 2010/0176448 A1* | 7/2010 | Hsieh ............................. | 257/334 |
| 2011/0073906 A1* | 3/2011 | Bobde et al. ................... | 257/147 |
| 2011/0121387 A1* | 5/2011 | Hebert et al. .................. | 257/334 |
| 2012/0018836 A1* | 1/2012 | Nagai et al. .................... | 257/471 |
| 2012/0181652 A1* | 7/2012 | Qu et al. ........................ | 257/471 |
| 2012/0241853 A1* | 9/2012 | Ohta et al. ..................... | 257/331 |

(Continued)

FOREIGN PATENT DOCUMENTS

| | | |
|---|---|---|
| JP | 05-110062 A | 4/1993 |
| JP | 2010-147399 A | 7/2010 |

*Primary Examiner* — Minh-Loan T Tran
*Assistant Examiner* — Fazli Erdem
(74) *Attorney, Agent, or Firm* — Holtz, Holtz, Goodman & Chick PC

(57) ABSTRACT

A semiconductor device includes a first-conductivity-type semiconductor substrate, a first first-conductivity-type semiconductor layer, a second first-conductivity-type semiconductor layer, a second-conductivity-type bottom layer, a Schottky metal, and a cathode electrode. The first first-conductivity-type semiconductor layer is provided on the semiconductor substrate and has a lower first-conductivity-type impurity concentration than the semiconductor substrate. The second first-conductivity-type semiconductor layer is provided on the first first-conductivity-type semiconductor layer and has a higher first-conductivity-type impurity concentration than the first first-conductivity-type semiconductor layer. The Schottky metal is provided on the second first-conductivity-type semiconductor layer. The Schottky metal contacts with partly the first first-conductivity-type semiconductor layer. The second-conductivity-type bottom layer is provided in the first first-conductivity-type semiconductor layer and is connected to the Schottky metal. The cathode electrode is connected to the semiconductor substrate.

13 Claims, 2 Drawing Sheets

(56) References Cited

U.S. PATENT DOCUMENTS

2012/0306009 A1* 12/2012 Kim ............................. 257/334
2013/0001699 A1* 1/2013 Tai et al. ...................... 257/368
2013/0075808 A1* 3/2013 Calafut et al. ................ 257/328
2013/0285072 A1* 10/2013 Iwamuro ........................ 257/77
2013/0307111 A1* 11/2013 Mizushima et al. .......... 257/484
2013/0313638 A1* 11/2013 Yoshimochi .................. 257/334
2014/0035090 A1* 2/2014 Qu et al. ....................... 257/475

* cited by examiner

SEMICONDUCTOR DEVICE

CROSS-REFERENCE TO RELATED APPLICATION

This application is based upon and claims the benefit of priority from Japanese Patent Application No. 2012-276212, filed on Dec. 18, 2012; the entire contents of which are incorporated herein by reference.

FIELD

Embodiments described herein relate generally to a semiconductor device.

BACKGROUND

In a Schottky barrier diode, reduction of forward voltage and reduction of reverse current are required. However, there is a tradeoff therebetween, i.e., reduction of forward voltage results in increase of reverse current. In order to suppress the increase of reverse current while reducing the forward voltage, in a Schottky barrier diode, a Schottky metal is formed on the surface of an n-type semiconductor layer with a plurality of trenches formed therein. In this Schottky barrier diode, by increasing the Schottky junction area, the forward voltage is reduced. However, in this Schottky barrier diode, if the trench is made deeper to reduce the forward voltage, the resistance of the mesa portion between the trenches constituting a current path is increased. Thus, the forward voltage cannot be reduced as intended. There is demand for providing a Schottky barrier diode capable of reducing the forward voltage while suppressing the reverse current.

DETAILED DESCRIPTION

A semiconductor device includes a first-conductivity-type semiconductor substrate, a first first-conductivity-type semiconductor layer, a second first-conductivity-type semiconductor layer, a second-conductivity-type bottom layer, a Schottky metal, and a cathode electrode. The first first-conductivity-type semiconductor layer is provided on the semiconductor substrate and has a lower first-conductivity-type impurity concentration than the semiconductor substrate. The second first-conductivity-type semiconductor layer is provided on the first first-conductivity-type semiconductor layer and has a higher first-conductivity-type impurity concentration than the first first-conductivity-type semiconductor layer. The Schottky metal is provided on the second first-conductivity-type semiconductor layer. The Schottky metal contacts with partly the first first-conductivity-type semiconductor layer. The second-conductivity-type bottom layer is provided in the first first-conductivity-type semiconductor layer and is connected to the Schottky metal. The cathode electrode is connected to the semiconductor substrate.

Embodiments of the invention will now be described with reference to the drawings. The figures used in describing the embodiments are schematic for ease of description. The shape, dimension, size relation and the like of components in the figures are not necessarily identical to those in practical application, and can be appropriately modified as long as the effects of the invention are achieved. In the following description, the first conductivity type is n-type, and the second conductivity type is p-type. However, these conductivity types can be interchanged. In the following description, regarding the semiconductor, silicon is taken as an example. However, the embodiments are also applicable to compound semiconductors such as silicon carbide (SiC) and nitride semiconductors (AlGaN). In the case where the n-type conductivity is denoted by $n^+$, n, and $n^-$, it is assumed that the n-type impurity concentration is decreased in this order.

First Embodiment

Figure 1:
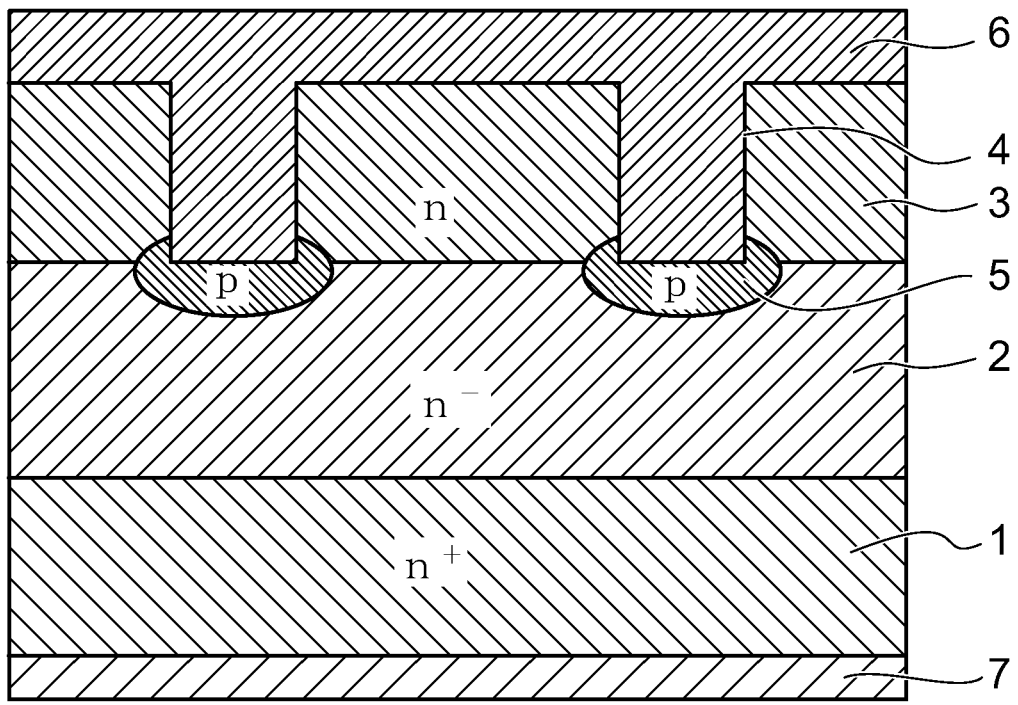
FIG. 1 is a main part schematic sectional view of the semiconductor device according to a first embodiment.
Figure 2:
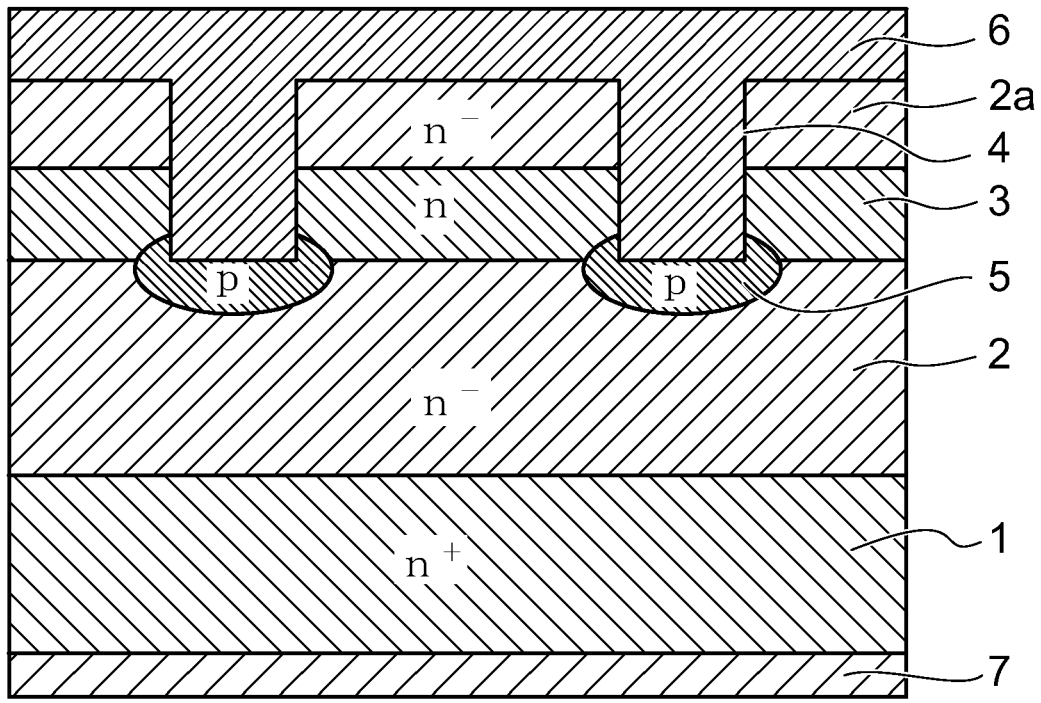
FIG. 2 is a main part schematic sectional view of an alternative example of the semiconductor device according to the first embodiment.

With reference to FIGS. 1 and 2, a semiconductor device according to a first embodiment of the invention is described. FIG. 1 is a main part schematic sectional view of the semiconductor device according to this embodiment. FIG. 2 is a main part schematic sectional view of an alternative example of the semiconductor device according to this embodiment. The semiconductor device according to this embodiment includes an $n^+$-type semiconductor substrate 1 (first-conductivity-type semiconductor substrate), an $n^-$-type epitaxial layer 2 (first first-conductivity-type semiconductor layer), an n-type semiconductor layer 3 (second first-conductivity-type semiconductor layer), adjacent p-type bottom layers 5 (second-conductivity-type bottom layers), a Schottky metal 6, and a cathode electrode 7. The semiconductor layers are made of e.g. silicon.

The $n^-$-type epitaxial layer 2 is provided on the $n^+$-type semiconductor substrate 1 and has a lower n-type impurity concentration than the $n^+$-type semiconductor substrate 1. The $n^-$-type epitaxial layer 2 is formed by e.g. CVD (chemical vapor deposition) technique. The n-type impurity concentration of the $n^+$-type semiconductor substrate 1 is e.g. $1 \times 10^{19}$-$1 \times 10^{20}$/cm$^3$. The n-type impurity concentration of the $n^-$-type epitaxial layer 2 is e.g. $1 \times 10^{16}$-$1 \times 10^{17}$/cm$^3$.

The n-type semiconductor layer 3 is provided on the $n^-$-type epitaxial layer 2 and has a higher n-type impurity concentration than the $n^-$-type epitaxial layer 2. The n-type impurity concentration of the n-type semiconductor layer 3 is e.g. $1 \times 10^{17}$-$1 \times 10^{18}$/cm$^3$. The n-type semiconductor layer 3 can be formed e.g. as an n-type epitaxial layer on the $n^-$-type epitaxial layer 2 by CVD technique. In this case, as shown in FIG. 1, the n-type impurity concentration of the n-type semiconductor layer 3 is nearly uniform in the direction (stacking direction) perpendicular to the junction surface between the $n^-$-type epitaxial layer 2 and the $n^+$-type semiconductor substrate 1.

Alternatively, the n-type semiconductor layer 3 can also be formed as an n-type impurity diffusion layer by performing ion implantation of n-type impurity and heat treatment on the upper surface of the $n^-$-type epitaxial layer 2. In this case, the n-type impurity concentration of the n-type semiconductor layer 3 gradually increases from the upper surface of the n-type semiconductor layer 3 (the surface on the opposite side from the $n^+$-type semiconductor substrate 1) toward the $n^+$-type semiconductor substrate 1, reaches the maximal value, and then gradually decreases. The n-type impurity concentration of the n-type semiconductor layer 3 in this case is e.g. $1 \times 10^{17}$-$1 \times 10^{18}$/cm$^3$ on average.

The position of the maximal value of the impurity concentration of the n-type semiconductor layer 3 can be adjusted by the acceleration voltage for ion implantation. For instance, the ion implantation of n-type impurity is performed so that the maximal value of the n-type impurity concentration is located at a depth near the upper surface of the n-type semiconductor layer 3. However, in the case of decreasing the n-type impurity concentration near the upper surface of the n-type semiconductor layer 3, the ion implantation of n-type impurity is performed so that the maximal value of the n-type impurity concentration is located at a depth on the bottom side of the center of the n-type semiconductor layer 3.

In this case, the structure in the stacking direction can also be regarded as a structure in which, as shown in FIG. 2, from the $n^+$-type semiconductor substrate 1 side, the $n^-$-type epitaxial layer 2, the n-type semiconductor layer 3, and a portion 2a of the $n^-$-type epitaxial layer 2 are sequentially arranged. Here, the portion 2a of the $n^-$-type epitaxial layer 2 refers to the portion of the $n^-$-type epitaxial layer 2 separated from the $n^-$-type epitaxial layer 2 by the n-type semiconductor layer 3 being an n-type impurity diffusion layer.

Thus, the maximal value of the n-type impurity concentration of the n-type semiconductor layer 3 can be distributed on the bottom side of the center of the n-type semiconductor layer 3. Accordingly, the n-type impurity concentration near the upper surface of the n-type semiconductor layer 3 can be made comparable to the n-type impurity concentration of the $n^-$-type epitaxial layer 2. Then, a Schottky metal is formed on the upper surface of the n-type semiconductor layer 3. This has the advantage that a depletion layer due to Schottky junction easily spreads in the n-type semiconductor layer 3 toward the $n^+$-type semiconductor substrate 1 side.

A plurality of trenches 4 extending in the n-type semiconductor layer 3 from the upper surface of the n-type semiconductor layer 3 (or the upper surface of the aforementioned portion 2a of the $n^-$-type epitaxial layer) toward the $n^-$-type epitaxial layer 2 and reaching the $n^-$-type epitaxial layer 2 are provided. For instance, the plurality of trenches are equally spaced from each other along one direction parallel to the junction surface between the $n^+$-type semiconductor substrate 1 and the $n^-$-type epitaxial layer 2. The portion (hereinafter mesa portion) of the n-type semiconductor layer 3 sandwiched between adjacent ones of the plurality of trenches 4 has a mesa shape. The mesa portion may be composed only of the n-type semiconductor layer 3 or, as described above, may be composed of the n-type semiconductor layer 3 and the portion 2a of the $n^-$-type epitaxial layer 2.

The p-type bottom layer 5 is provided at the bottom portion of each trench 4. The p-type bottom layer 5 is contiguous to the $n^-$-type epitaxial layer 2 and the n-type semiconductor layer 3. The p-type bottom layers 5 are adjacent to each other via the $n^-$-type epitaxial layer 2 and the n-type semiconductor layer 3. The p-type bottom layer 5 is formed as a p-type impurity diffusion layer by performing ion implantation of p-type impurity and heat treatment on the bottom portion of each trench 4. The p-type impurity concentration of the p-type bottom layer 5 is e.g. $1 \times 10^{19}$-$1 \times 10^{20}$/cm$^3$.

In the above description of this embodiment, the trench 4 reaches the $n^-$-type epitaxial layer 2. However, the trench 4 does not need to reach the $n^-$-type epitaxial layer 2 as long as the bottom portion of the trench 4 is contiguous to the $n^-$-type epitaxial layer 2 via the p-type bottom layer 5.

The Schottky metal 6 is provided on the upper surface of the n-type semiconductor layer 3 and in the adjacent trenches 6. The Schottky metal 6 is electrically connected to the p-type bottom layer 5. The Schottky metal 6 forms a Schottky junction with the upper surface of the n-type semiconductor layer 3 of the mesa portion. The Schottky metal 6 forms a Schottky junction with the sidewall of the trench 4 formed from the n-type semiconductor layer 3. Alternatively, the Schottky metal 6 forms a Schottky barrier at the junction with the n-type semiconductor layer 3. The Schottky metal 6 is made of e.g. molybdenum or vanadium.

The cathode electrode 7 is provided on the lower surface of the $n^+$-type semiconductor substrate 1 on the opposite side from the $n^-$-type epitaxial layer 2. The cathode electrode 7 is ohmically connected to the $n^+$-type semiconductor substrate 1.

Next, the operation and advantage of the semiconductor device according to this embodiment are described. When a positive voltage relative to the cathode electrode 7 is applied to the Schottky metal 6 (forward bias), a current flows from the Schottky metal 6 through the n-type semiconductor layer 3 of the mesa portion to the cathode electrode 7. In contrast to the planar-type Schottky metal, the trench-type Schottky metal 6 is used. Thus, a Schottky junction is formed not only at the upper surface of the n-type semiconductor layer 3 of the mesa portion, but also at the sidewall of the trench 4 formed from the n-type semiconductor layer 3. Accordingly, the cross-sectional area of the current path is expanded. Thus, in the semiconductor device according to this embodiment, the forward voltage is low.

Furthermore, at the bottom portion of the trench 4, a PN junction diode composed of the p-type bottom layer 5 and the $n^-$-type epitaxial layer 2 is formed. However, the forward voltage of the Schottky barrier diode is far smaller than the forward voltage of the PN junction diode. Thus, little current flows in this PN junction diode. Accordingly, the forward current-voltage characteristic of the semiconductor device according to this embodiment is governed by the Schottky barrier diode portion formed from the n-type semiconductor layer 3 of the mesa portion and the Schottky metal 6.

When a negative voltage relative to the cathode electrode is applied to the Schottky metal 6 (reverse bias), the PN junction diode composed of the p-type bottom layer 5 and the $n^-$-type epitaxial layer 2, and the Schottky barrier diode portion of the mesa portion, are both subjected to reverse operation. Here, the reverse current of the PN junction diode is far smaller than the reverse current of the Schottky barrier diode. Thus, the reverse current of the semiconductor device according to this embodiment is mostly constituted by the reverse current through the Schottky junction between the n-type semiconductor layer 3 of the mesa portion and the Schottky metal 6. That is, also in the reverse direction, the current-voltage characteristic of the semiconductor device according to this embodiment is governed by the Schottky barrier diode portion formed from the n-type semiconductor layer 3 of the mesa portion and the Schottky metal 6.

Furthermore, in conjunction with the depletion layer spread from the upper surface of the n-type semiconductor layer 3 of the mesa portion and the sidewall of the trench 4 into the n-type semiconductor layer 3, the depletion layer spread from the p-type bottom layer 5 toward the n-type semiconductor layer 3 completely depletes the entirety of the n-type semiconductor layer 3 of the mesa portion. This relaxes the electric field at the Schottky junction formed at the interface between the Schottky metal 6 and the n-type semiconductor layer 3. As a result, the reverse current in the Schottky barrier diode portion of the mesa portion is reduced.

Moreover, in the semiconductor device according to this embodiment, the n-type impurity concentration of the n-type semiconductor layer 3 of the mesa portion is set higher than the n-type impurity concentration of the $n^-$-type epitaxial layer 2. Thus, compared with the case where the mesa portion consists only of the n⁻-type epitaxial layer 2, in the semiconductor device according to this embodiment, the forward voltage is further reduced.

In particular, as described above, in the case where the n-type semiconductor layer 3 is a diffusion layer of n-type impurity, the n-type impurity concentration of the n-type semiconductor layer 3 gradually increases from the upper surface of the n-type semiconductor layer 3 toward the n⁺-type semiconductor substrate 1 side. Thus, compared with the case where the n-type impurity concentration is constant, the depletion layer spreads more easily from the upper surface of the n-type semiconductor layer 3 into the n-type semiconductor layer 3. This relaxes the electric field at the Schottky junction portion at the upper surface of the n-type semiconductor layer 3. As a result, the reverse current is reduced.

Furthermore, as described above, the maximal value of the n-type impurity concentration of the n-type semiconductor layer 3 is located on the bottom side of the center of the n-type semiconductor layer 3. This enables a portion 2a of the n⁻-type epitaxial layer to exist in the upper portion of the n-type semiconductor layer 3 of the mesa portion as shown in FIG. 2. In this case, the depletion layer easily spreads further from the upper end of the mesa portion into the n-type semiconductor layer 3. This further promotes electric field relaxation in the Schottky junction at the upper end of the mesa portion. As a result, in the semiconductor device according to this embodiment, while reducing the forward voltage, the reverse current can be further reduced.

Second Embodiment

Figure 3:
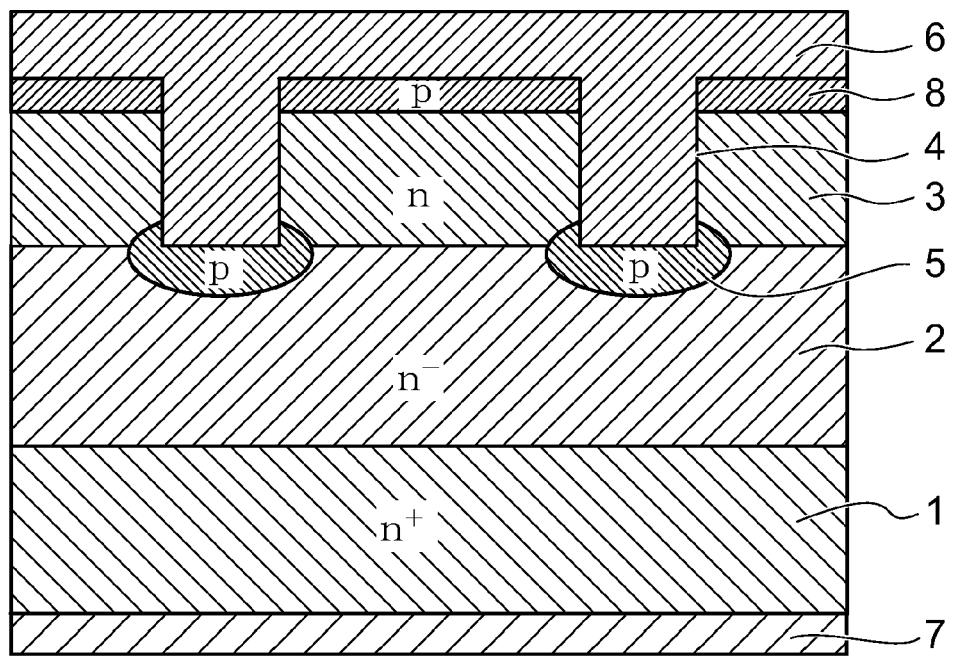
FIG. 3 is a main part schematic sectional view of the semiconductor device according to a second embodiment.

A semiconductor device according to a second embodiment is described with reference to FIG. 3. FIG. 3 is a main part schematic sectional view of the semiconductor device according to the second embodiment. The portions having the same configuration as those described in the first embodiment are labeled with like reference numerals or symbols, and the description thereof is omitted. The differences from the first embodiment are primarily described.

The semiconductor device according to this embodiment further includes a p-type semiconductor layer 8 between the n-type semiconductor layer 3 and the Schottky metal 6 in the stacking direction of the mesa portion. The p-type impurity concentration of the p-type semiconductor layer 8 is e.g. $1 \times 10^{19}$-$1 \times 10^{20}$/cm³. The p-type semiconductor layer 8 is e.g. a p-type impurity diffusion layer formed by performing ion implantation of p-type impurity and heat treatment.

The p-type semiconductor layer 8 is provided between adjacent trenches 4 in the mesa portion, and extends on the n-type semiconductor layer 3.

The semiconductor device according to this embodiment is different from the semiconductor device according to the first embodiment in the above points.

In the semiconductor device according to this embodiment, at the time of reverse bias, a depletion layer spreads from the p-n junction surface between the p-type semiconductor layer 8 and the n-type semiconductor layer 3 toward the n-type semiconductor layer 3. This depletion layer is combined with the depletion layer extending from the p-type bottom layer 5 into the n-type semiconductor layer 3. As a result, in the semiconductor device according to this embodiment, depletion of the n-type semiconductor layer 3 of the mesa portion occurs more easily than in the semiconductor device according to the first embodiment. This further promotes electric field relaxation in the Schottky junction between the Schottky metal 6 and the n-type semiconductor layer 3 at the sidewall of the trench 4. Thus, in the semiconductor device according to this embodiment, the reverse current can be further reduced than in the semiconductor device according to the first embodiment.

Also in the semiconductor device according to this embodiment, as in the semiconductor device according to the first embodiment, the structure of reducing the n-type impurity concentration on the upper surface side of the n-type semiconductor layer 3 of the mesa portion can be used. Thus, the reverse current can be further reduced.

Third Embodiment

Figure 4:
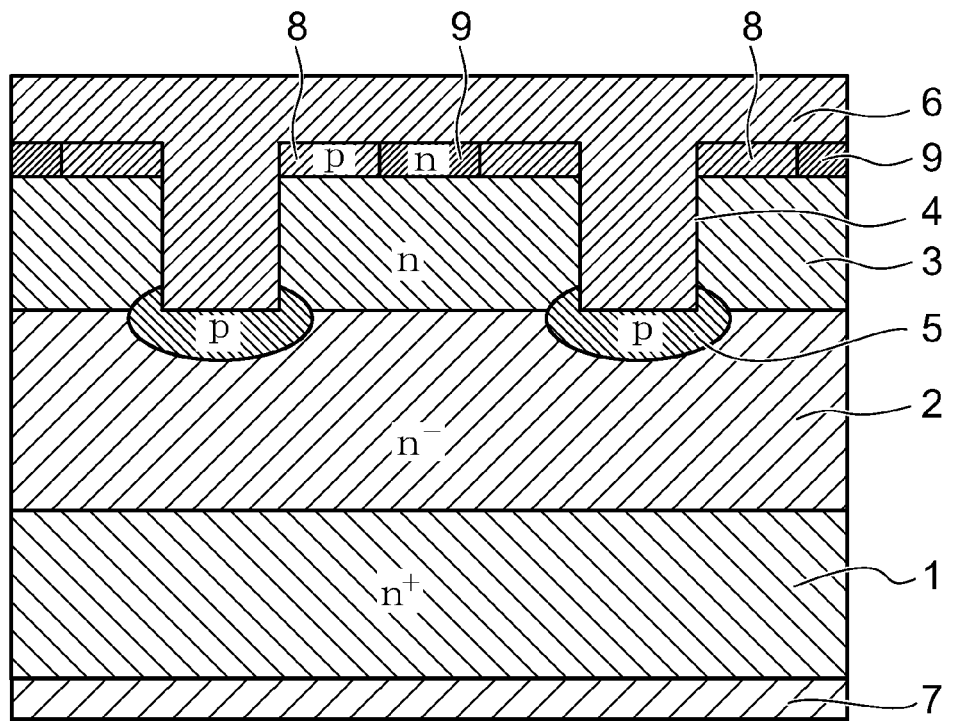
FIG. 4 is a main part schematic sectional view of the semiconductor device according to a third embodiment.

A semiconductor device according to a third embodiment is described with reference to FIG. 4. FIG. 4 is a main part schematic sectional view of the semiconductor device according to the third embodiment. The portions having the same configuration as those described in the second embodiment are labeled with like reference numerals or symbols, and the description thereof is omitted. The differences from the second embodiment are primarily described.

As shown in FIG. 4, the semiconductor device according to this embodiment further includes an n-type semiconductor layer 9. The n-type semiconductor layer 9 extends from the upper surface of the p-type semiconductor layer 8 on the opposite side from the n⁺-type semiconductor substrate 1 through the p-type semiconductor layer 8 to the n-type semiconductor layer 3. The semiconductor device according to this embodiment is different from the semiconductor device according to the second embodiment in this point.

The n-type semiconductor layer 9 is electrically connected to the Schottky metal 6. That is, the Schottky metal 6 is electrically connected to the n-type semiconductor layer 3 through the n-type semiconductor layer 9. The n-type semiconductor layer 9 is spaced from each of the adjacent trenches 4 via the p-type semiconductor layer 8.

For instance, the n-type semiconductor layer 9 can consist of a portion 2a of the n⁻-type epitaxial layer 2 as shown in FIG. 2. That is, as described in the first embodiment, in the mesa portion, the n-type semiconductor layer 3 is formed as an n-type impurity diffusion layer in the n⁻-type epitaxial layer 2. Thus, a portion 2a of the n⁻-type epitaxial layer separated from the n⁻-type epitaxial layer 2 by the n-type semiconductor layer 3 is formed in the upper portion of the mesa portion. Then, p-type impurity is selectively diffused in the portion at both ends of the portion 2a of the n⁻-type epitaxial layer 2 formed in the upper portion of the mesa portion and constituting the upper end of the sidewall of the trench 4. Thus, a p-type semiconductor layer 8 is selectively formed. As a result, the portion of the portion 2a of the n⁻-type epitaxial layer 2 in the upper portion of the mesa portion where the p-type semiconductor layer 8 is not formed constitutes an n-type semiconductor layer 9.

Alternatively, the n-type semiconductor layer 9 can consist of a portion of the upper portion of the n-type semiconductor layer 3. Regarding the formation method, as in the foregoing, this portion can be formed by selectively forming a p-type impurity diffusion layer in the upper surface of the n-type semiconductor layer 3.

By the formation method as described above, the n-type impurity concentration of the n-type semiconductor layer 9 can be set more than or equal to the n-type impurity concentration of the n⁻-type epitaxial layer 2 and less than or equal to the n-type impurity concentration of the n-type semiconductor layer 3.

The n-type semiconductor layer 9 forms a Schottky junction with the Schottky metal 6 at the upper surface of the mesa portion. Thus, the n-type semiconductor layer 9 provided in the upper portion of the mesa portion functions as a Schottky barrier diode. Accordingly, in the semiconductor device according to this embodiment, the forward voltage can be further reduced than in the semiconductor device according to the second embodiment. Otherwise, the semiconductor device according to this embodiment achieves effects similar to those of the semiconductor device according to the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first-conductivity-type semiconductor substrate;
   a first first-conductivity-type semiconductor layer provided on the semiconductor substrate and having a lower first-conductivity-type impurity concentration than the semiconductor substrate;
   a second first-conductivity-type semiconductor layer provided on the first first-conductivity-type semiconductor layer and having a higher first-conductivity-type impurity concentration than the first first-conductivity-type semiconductor layer;
   a Schottky metal provided on the second first-conductivity-type semiconductor layer and partly contacting with the first first-conductivity-type semiconductor layer;
   a second-conductivity-type bottom layer provided in the first first-conductivity-type semiconductor layer and connected to the Schottky metal; and
   a cathode electrode connected to the semiconductor substrate;
   wherein the first-conductivity-type impurity concentration of the second first-conductivity-type semiconductor layer gradually increases from an end on an opposite side from the semiconductor substrate toward an end on the semiconductor substrate side, and then gradually decreases.

2. The device according to claim 1, wherein an interface between the Schottky metal and the second-conductivity-type bottom layer is located on a semiconductor substrate side of the second first-conductivity-type semiconductor layer.

3. The device according to claim 1, further comprising:
   a second-conductivity-type semiconductor layer provided between the Schottky metal and a portion of the second first-conductivity-type semiconductor layer sandwiched between the Schottky metal.

4. The device according to claim 3, further comprising:
   a third first-conductivity-type semiconductor layer electrically connected to the Schottky metal and extending from an upper surface of the second-conductivity-type semiconductor layer to the second first-conductivity-type semiconductor layer.

5. A semiconductor device comprising:
   a first-conductivity-type semiconductor substrate;
   a first first-conductivity-type semiconductor layer provided on the semiconductor substrate and having a lower first-conductivity-type impurity concentration than the semiconductor substrate;
   a second first-conductivity-type semiconductor layer provided on the first first-conductivity-type semiconductor layer and having a higher first-conductivity-type impurity concentration than the first first-conductivity-type semiconductor layer;
   a Schottky metal provided on the second first-conductivity-type semiconductor layer and partly contacting with the first first-conductivity-type semiconductor layer;
   a second-conductivity-type bottom layer provided in the first first-conductivity-type semiconductor layer and connected to the Schottky metal;
   a cathode electrode connected to the semiconductor substrate;
   a second-conductivity-type semiconductor layer provided between the Schottky metal and a portion of the second first-conductivity-type semiconductor layer sandwiched between the Schottky metal; and
   a third first-conductivity-type semiconductor layer electrically connected to the Schottky metal and extending from an upper surface of the second-conductivity-type semiconductor layer to the second first-conductivity-type semiconductor layer;
   wherein a first-conductivity-type impurity concentration of the third first-conductivity-type semiconductor layer is lower than the first-conductivity-type impurity concentration of the second first-conductivity-type semiconductor layer.

6. The device according to claim 4, wherein the second first-conductivity-type semiconductor layer is a diffusion layer of first-conductivity-type impurity, and the third first-conductivity-type semiconductor layer is a portion of the first first-conductivity-type semiconductor layer separated from the first first-conductivity-type semiconductor layer by the second first-conductivity-type semiconductor layer.

7. The device according to claim 4, wherein the third first-conductivity-type semiconductor layer is sandwiched between the second-conductivity-type semiconductor layer.

8. The device according to claim 5, wherein the first-conductivity-type impurity concentration of the second first-conductivity-type semiconductor layer gradually increases from an end on an opposite side from the semiconductor substrate toward an end on the semiconductor substrate side, and then gradually decreases.

9. The device according to claim 3, wherein an upper surface and a side surface of the second-conductivity-type semiconductor layer contact with the Schottky metal.

10. The device according to claim 5, wherein the second-conductivity-type semiconductor layer constitutes an upper end of a sidewall of a trench.

11. A semiconductor device comprising:
    a first-conductivity-type semiconductor substrate;
    a first first-conductivity-type semiconductor layer provided on the semiconductor substrate and having a lower first-conductivity-type impurity concentration than the semiconductor substrate;
    a second first-conductivity-type semiconductor layer provided on the first first-conductivity-type semiconductor layer and having a higher first-conductivity-type impurity concentration than the first first-conductivity-type semiconductor layer;
    a Schottky metal provided on the second first-conductivity-type semiconductor layer and partly contacting with the first first-conductivity-type semiconductor layer;
    a second-conductivity-type bottom layer provided in the first first-conductivity-type semiconductor layer and connected to the Schottky metal;

a cathode electrode connected to the semiconductor substrate; and a third first-conductivity-type semiconductor layer electrically connected to the Schottky metal and provided on the second first-conductivity-type semiconductor layer, wherein a first-conductivity-type impurity concentration of the third first-conductivity-type semiconductor layer is lower than the first-conductivity-type impurity concentration of the second first-conductivity-type semiconductor layer.

12. The device according to claim 11, wherein the second first-conductivity-type semiconductor layer is a diffusion layer of first-conductivity-type impurity, and the third first-conductivity-type semiconductor layer is a portion of the first first-conductivity-type semiconductor layer separated from the first first-conductivity-type semiconductor layer by the second first-conductivity-type semiconductor layer.

13. The device according to claim 11, wherein the first-conductivity-type impurity concentration of the second first-conductivity-type semiconductor layer gradually increases from an end on an opposite side from the semiconductor substrate toward an end on the semiconductor substrate side, and then gradually decreases.

* * * * *